(12) United States Patent
Royter et al.

(10) Patent No.: US 8,900,896 B1
(45) Date of Patent: Dec. 2, 2014

(54) IMPLANTATION BEFORE EPITAXIAL GROWTH FOR PHOTONIC INTEGRATED CIRCUITS

(75) Inventors: Yakov Royter, Santa Monica, CA (US); Rajesh D. Rajavel, Oak Park, CA (US); Stanislav I. Ionov, Calabasas, CA (US); Irina Ionova, legal representative, Calabasas, CA (US); Sophi Ionova, legal representative, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 947 days.

(21) Appl. No.: 13/030,094

(22) Filed: Feb. 17, 2011

Related U.S. Application Data

(62) Division of application No. 11/528,797, filed on Sep. 27, 2006, now Pat. No. 7,932,512.

(51) Int. Cl.
*H01L 21/00* (2006.01)
(52) U.S. Cl.
USPC .............. 438/29; 438/31; 438/47; 438/478
(58) Field of Classification Search
None
See application file for complete search history.

(56) References Cited

U.S. PATENT DOCUMENTS

| | | | |
|---|---|---|---|
| 5,023,687 A | 6/1991 | Tanoue et al. | |
| 7,199,441 B2 * | 4/2007 | Shimizu et al. | 257/446 |
| 2003/0081878 A1 | 5/2003 | Joyner et al. | |
| 2004/0033004 A1 | 2/2004 | Welch et al. | |
| 2005/0135778 A1 | 6/2005 | Dominic et al. | |
| 2005/0275053 A1 * | 12/2005 | Shimizu et al. | 257/446 |
| 2006/0065886 A1 | 3/2006 | Shi et al. | |
| 2006/0141682 A1 | 6/2006 | Taylor et al. | |
| 2008/0048225 A1 | 2/2008 | Ahn et al. | |

* cited by examiner

*Primary Examiner* — David E Graybill
(74) *Attorney, Agent, or Firm* — Christie, Parker & Hale, LLP

(57) ABSTRACT

Fabrication of a photonic integrated circuit (PIC) including active elements such as a semiconductor optical amplifier (SOA) and passive elements such as a floating rib waveguide. Selective area doping through ion implantation or thermal diffusion before semiconductor epitaxial growth is used in order to define the contact and lateral current transport layers for each active device, while leaving areas corresponding to the passive devices undoped. InP wafers are used as the substrate which may be selectively doped with silicon.

14 Claims, 18 Drawing Sheets

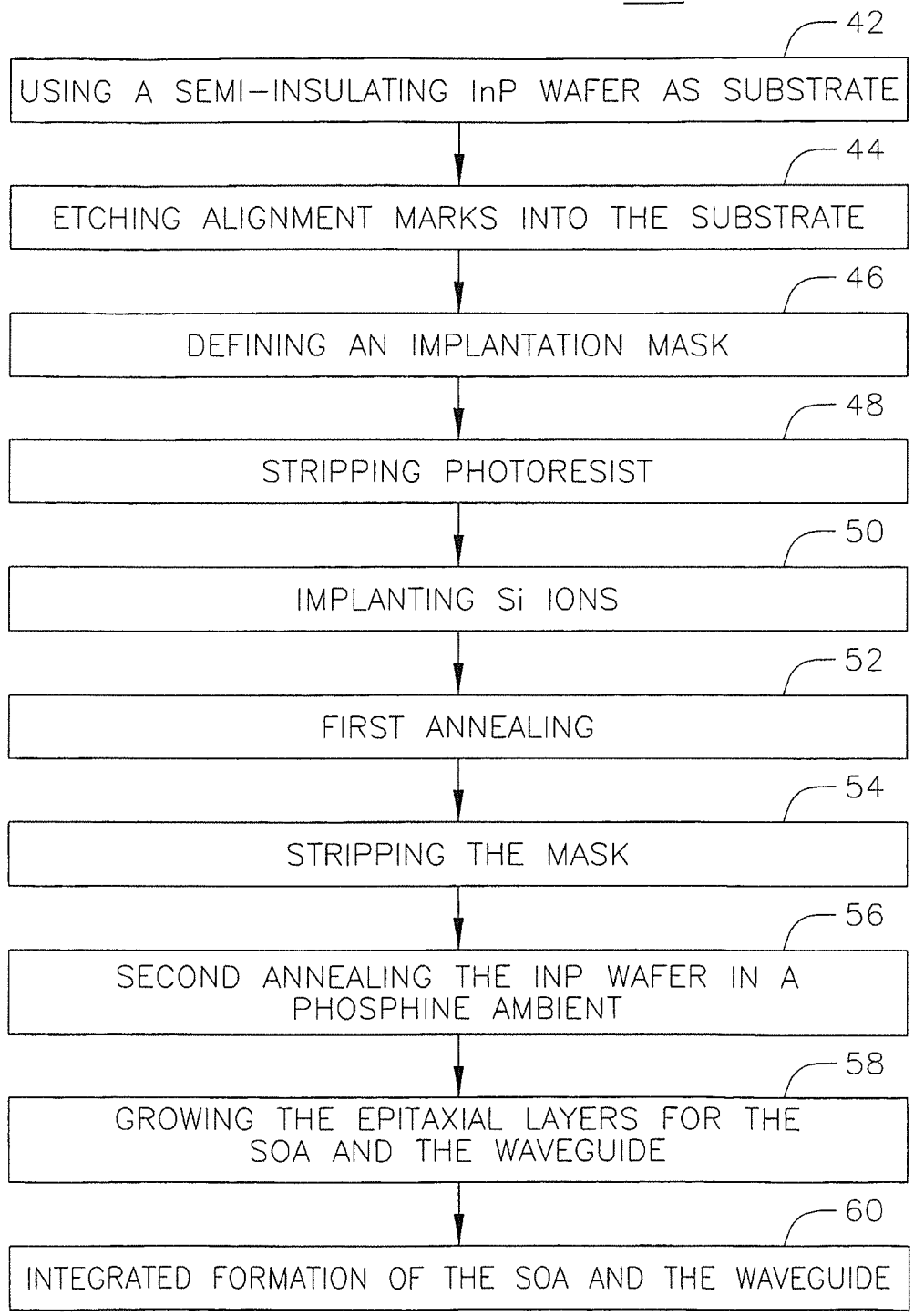

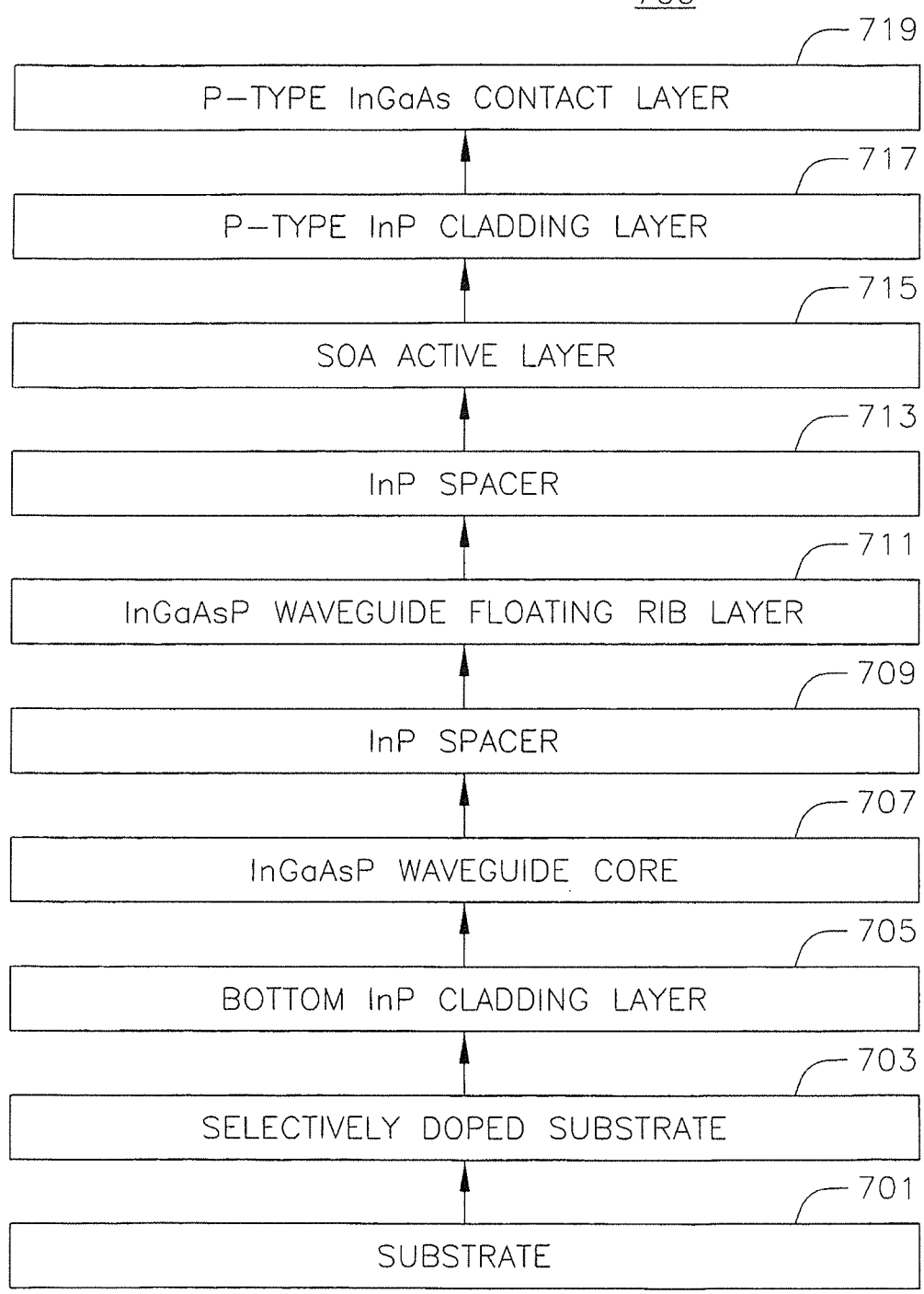

FIG.7C
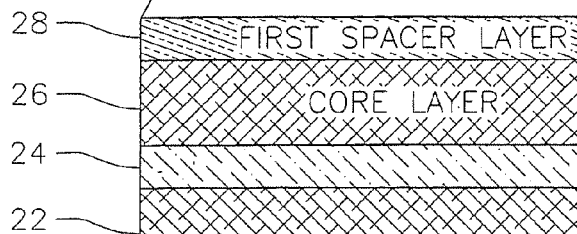
709
711
713

IMPLANTATION BEFORE EPITAXIAL GROWTH FOR PHOTONIC INTEGRATED CIRCUITS

CROSS-REFERENCE TO RELATED APPLICATION(S)

This application is a divisional of U.S. application Ser. No. 11/528,797, filed on Sep. 27, 2006 now U.S. Pat. No. 7,932,512, the entire content of which is hereby expressly incorporated by reference.

BACKGROUND OF THE INVENTION

This invention relates to the field of ion implantation in epitaxial growth and, more particularly, to selective area doping (SAD) in photonic integrated circuits (PICs) and especially to SAD in InP-based PICs.

PICs are formed from monolithic integration of two or more optical or optoelectronic devices on a single substrate. They are the photonic equivalent of microelectronic chips, which integrate two or more transistors on a chip to form an electronic integrated circuit (IC). However, instead of guiding electricity, a PIC routes photons.

In PICs, waveguides that are usually made of silica or polymers, or semiconductors act as the photonic analog of copper circuits, serving as interconnects among various discrete components on a chip. Waveguides are passive devices that provide a conduit for light travel. Examples of other passive devices include couplers, splitters, resonators, and gratings. The PIC usually also includes active devices. Examples of active devices include lasers, modulators, amplifiers, and detectors.

In most conventional PICs, the layers for the passive devices are grown in the same stack as the semiconductors layers for the active devices. As a result, the doped layers required for the active devices are present close to the passive device layers. Doped layers of active devices interact with light and, by absorbing the photons, impair light travel through the overall photonic device. In order to reduce passive device losses, doped layers are formed with lower than optimal doping concentrations and are placed farther away from the active layer of the active devices. Both of these modifications compromise the performance of the device by increasing series resistance.

In short, fabricating active and passive photonic devices within the same PIC, has so far caused a deterioration in overall PIC performance due to doped layers required for the active devices that cause an optic loss in the passive devices as well.

One method of eliminating the interference of doped layers of the active devices with the travel of light through the passive devices is etching the doped layers where only the passive device would be formed and regrowing the layers required for the passive device. This method, however, has processing drawbacks. The etched areas will not be as smooth as the neighboring areas and the subsequent regrowing will not be of a high quality.

Another method of reducing the interference of doped layers with the passage of light through the passive layers is to grow spacers separating these layers from the active layers. However, in conventional PICs, separating the wave guiding core layer from the doped layers increases the thickness of the PIC epitaxial layer stack. Increasing the thickness of the stack does not merely increase the size. Rather, thick stacks have higher defect densities and make it harder to produce high quality material. Thicker stacks also mean higher mesas and less planar PICs. Decrease in planarity makes lithographic printing of fine features needed for couplers, splitters, and gratings very difficult due to poor control of resist thickness and optical focus. Finally, monolithic integration of these PICs with electronic ICs is made difficult if the optical component layers are thick.

A conventional PIC is shown in FIG. 1. The conventional PIC includes an amplifier section 1, such as a semiconductor optical amplifier (SOA), as the active device and a waveguide section 2 as the passive device. The semiconductor layers forming the conventional PIC include a substrate 3, a doped layer 4, a cladding layer 5, a wave guiding core layer 6, a rib layer 8, an active layer 13, a P-type cladding layer 15, and a heavily doped P-type contact layer 17. Additionally, a P-type metal 19 may be patterned over the top of the semiconductor layers in order to provide ohmic contact for the active device. Spacers 7, 9 separate the core layer 6 and the active layer 13 from the rib layer 8. The active layer may be used for either absorption or generation of light. The doped layers or regions may be highly doped regions that provide a low resistance path for the carriers and upon which an ohmic contact may be formed. The P-type cladding layer and the core layer may have a wider band gap than the active layer.

In the conventional PIC, the doped layer 4 unnecessarily extends under the passive device section, which is the waveguide section 2 in the example shown. The mobile charge resulting from doping in the doped layer 4 interacts with the light traveling through the waveguide core layer 6. Absorption of photons by the charge in the doped region causes a loss in the light traveling through the waveguide section 2.

One method to remedy the optical loss resulting from the proximity of the waveguide core layer 6 and the doped layer 4 is using spacers between the two that minimize the interaction of the two layers 6, 4. However, separating the wave guiding core layer 6 from the doped layer 4 still compromises the performance of the active device 1 while increasing the thickness of the PIC epitaxial layer stack.

For example, for a waveguide made from undoped layers with a total stack thickness of less than 1 µm, optical loss is approximately 0.25 db/cm. Introducing a doped layer and a 0.3 µm undoped spacer produces a loss of greater than 10 db/cm. Growing a 1 µm spacer, which more than doubles the stack thickness, decreases the loss to only about 1.5 db/cm, which is not acceptable for most applications. The stack thickness would have to be tripled to bring losses to approximately over 0.5 db/cm. This loss is still more than double the low loss associated with undoped waveguides.

A common method of integrating a passive component and an active component in a PIC starts with a single stack of semiconductor epitaxial layers where some of the active device layers are the layers also necessary for the passive devices. Usually the top doped layers are removed in the areas outside of the active device area. Selective area regrowth may be performed in the passive device areas to deposit cladding material or in the active device areas to deposit top contact material. Using some of the active device layers for the passive devices ensures that the majority of the propagating light field does not have an abrupt interface traveling between the active and passive components. Nevertheless, the bottom doped layer still remains, causing loss in the active components.

In some conventional cases all of the layers of the active device, including both top and bottom doped layers, are removed and the passive device layers are selectively regrown. In such cases, all of the optical field sees an abrupt interface between the active and passive devices. Obtaining a smooth interface is extremely difficult, because the orientation of the vertical face of the etched feature, the availability of reactants (in a chemical vapor deposition case), and smoothness of the face will be different from the rest of the wafer.

In a few conventional cases, the epitaxial stack does not include doped layers, but instead N-type and P-type contact areas are defined on the sides of active devices. Compared with the vertical transport devices, this type of lateral transport active device is inferior due to increased series resistance and decreased electric field strength.

Additionally, SAD implantation through the device layers is not possible for most InP related devices because damage introduced by implantation is addressed by annealing at temperatures that cause heterointerface degradation and dopant movement and in some cases crystal stoichiometry degradation.

Therefore, there is a need for improved methods of preventing or reducing the interference of doped areas of active devices with the passage of light through passive devices on a PIC.

SUMMARY OF THE INVENTION

Selective area doping (SAD) enables optimal layer structures to be used for the active devices, while keeping the loss in passive components low. Moreover, by performing multiple implantation steps, it is possible to optimize each active device on a single PIC separately. Further, SAD eliminates the need for thick layers and allows the fabrication of a wider variety of PICs. SAD and epitaxial growth may be repeated multiple times in an alternating fashion. The alternating series of processes may begin with SAD as the first step or by epitaxial growth as the first step.

One embodiment of the invention presents a photonic integrated circuit including a substrate formed from a compound semiconductor material, such as an InP related material or GaAs, an active device section fabricated over a first part of the substrate, and a passive device section fabricated over a second part of the substrate. In this embodiment, the substrate includes a doped area in the first part of the substrate corresponding to the active device section. Further, layers forming the active device section and the passive device section are epitaxially grown over the substrate.

In one embodiment, the substrate is selectively doped with dopant material only in the first part and not in the second part.

In one embodiment, a method for fabricating a photonic integrated circuit is provided that includes at least one passive device and at least one active device. The method includes providing a semi-insulating InP related material as a substrate, defining an implantation mask over the substrate leaving a first area of the substrate exposed, doping the first area with an impurity, first annealing, stripping the mask, second annealing in a phosphate ambient, and growing epitaxial layers over the substrate.

BRIEF DESCRIPTION OF THE DRAWINGS

FIG. 6 shows a flow chart for a fabrication process of a PIC according to the embodiments of the invention.

FIG. 7A shows a flow chart of an exemplary order of formation of various epitaxial layers of the PIC of FIG. 2.

FIGS. 7B, 7C, 7D, and 7E show perspective views of the formation of the epitaxial layers according to the flow chart of FIG. 7A.

DETAILED DESCRIPTION

Embodiments of the invention include using selective area doping (SAD) in photonic integrated circuits (PICs). Implantation, diffusion, or other methods of doping of electrically active species provide defined areas for electrical contact and lateral current transport in active devices. The passive device areas are not doped. SAD also results in PICs of smaller thickness. Smaller thicknesses, in turn, further enhance the efficiency of charge transport and reduce process complexity. Accordingly, this method and the resulting device allow optimal active device structures, while simultaneously minimizing passive device absorption loss.

Embodiments of the present invention allow passive components of the PIC, such as waveguides, couplers, and splitters, to have much lower optical loss, while enabling optimization of the active devices such as lasers, modulators, detectors, and amplifiers. Selective area doping allows doping only those areas where active devices are located. The rest of the PIC, where passive devices are located, would remain undoped thus minimizing loss due to free carrier absorption. SAD may be achieved by selective area implantation or other means such as thermal diffusion.

Figure 1:
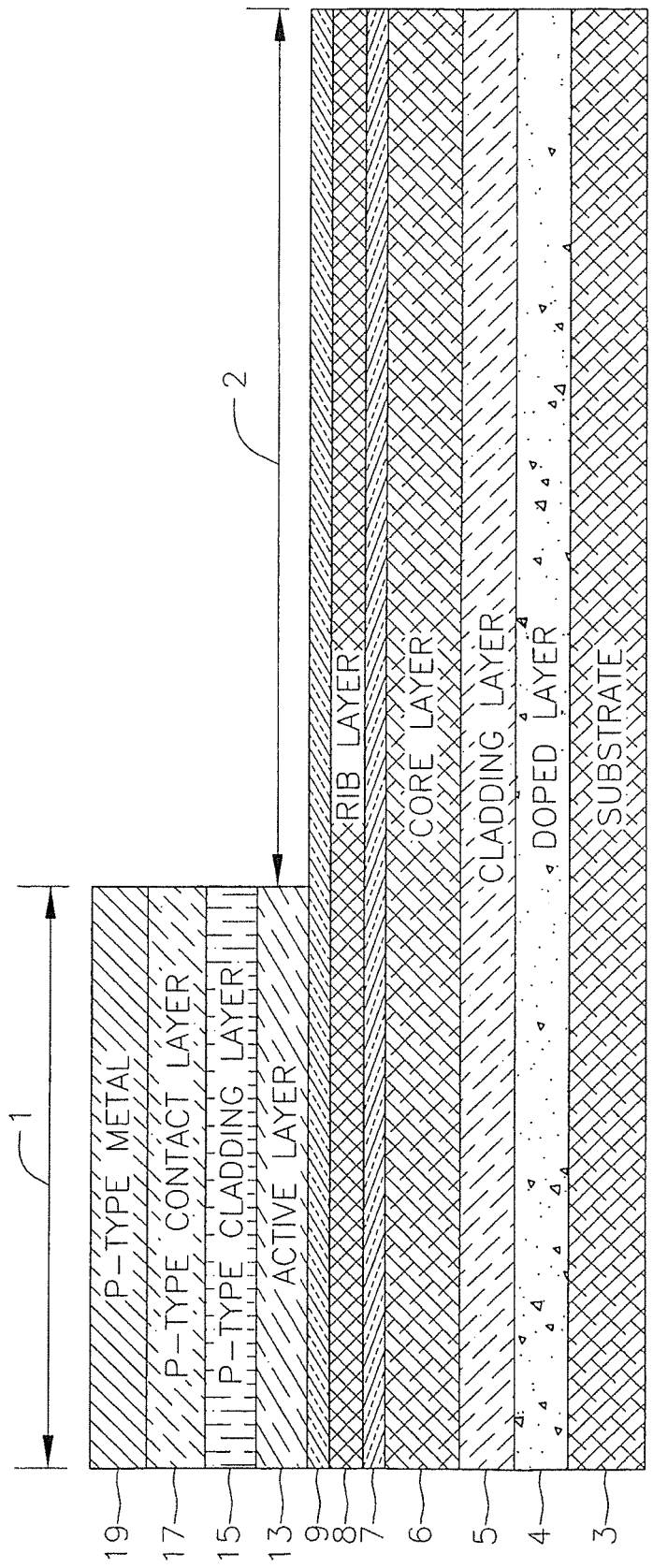
FIG. 1 shows a longitudinal cross-section of a conventional PIC including an active device and a passive device.

Another aspect of SAD is that the resulting PICs are not constrained to have all of the P-type layers on top and all of the N-type layers on the bottom, or vice versa. Active devices may be mixed, with some devices having their corresponding P-type layers on top and some other devices on the same PIC having their corresponding P-type layers at the bottom. Finally, for some devices, defining the bottom electrode size, for example the doped layer 4 in FIG. 1, by implantation rather than etching could reduce the size of the electrode, reducing device capacitance and increasing the speed.

Figure 2:
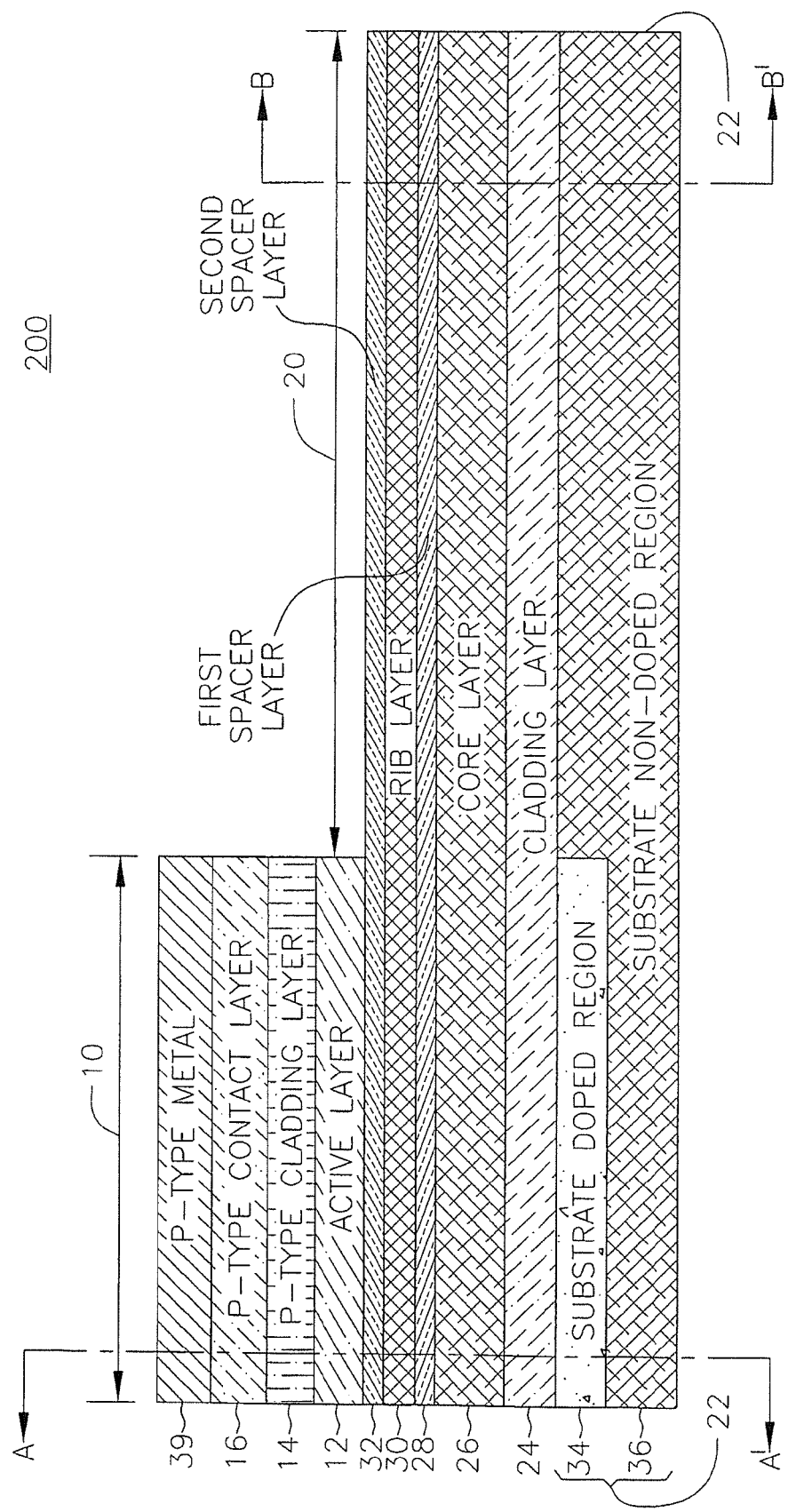
FIG. 2 shows a longitudinal cross-section of a PIC including a semiconductor optical amplifier (SOA) section and a waveguide section according to embodiments of the invention.

FIG. 2 shows a longitudinal cross-section of a PIC 200 including a SOA section 10 and a waveguide section 20 according to embodiments of the invention. A substrate 22 is partially implanted with a dopant giving rise to a substrate doped region 34 and a substrate non-doped region 36. In various embodiments of the invention, methods of doping other than implantation may also be used. The substrate doped region 34 corresponds to the SOA section 10 and the substrate non-doped region 36 corresponds to the waveguide section 20. In the embodiment shown, the substrate doped region 34 is doped with N-type dopant material. The substrate 22 is overlaid by a cladding layer 24. The cladding layer 24 is overlaid by a waveguide core layer 26. The waveguide core layer 26 is overlaid by a rib layer 30. A first spacer layer 28 separates the waveguide core layer 26 from the rib layer 30. The rib layer 30 is overlaid by a second spacer layer 32.

The second spacer layer 32 is partially overlaid by an active layer 12 in an area corresponding to the SOA section 10. The active layer 12 does not extend over the waveguide section 20. The active layer 12 is overlaid by a P-type cladding layer 14 which is in turn overlaid by a P-type contact layer 16. The active layer 12, the P-type cladding layer 14, and the P-type contact layer 16 are all parts of the SOA section 10 but not the waveguide section 20. A contact metal such as a P-type metal 39 is formed over the P-type contact layer 16. The P-type metal 39 may be formed from a metal that is suitable for establishing ohmic contact with a P-type semiconductor. The P-type metal 39 provides ohmic contact to elements outside the PIC 200. In other embodiments, the p-type metal 39 may be replaced with another conductive material. Also, if the active device includes N-type layers, then the ohmic contact would be formed of an N-type metal or other conductive material. The N-type metal may be formed from a metal that is suitable for establishing ohmic contact with an N-type semiconductor.

Figure 3:
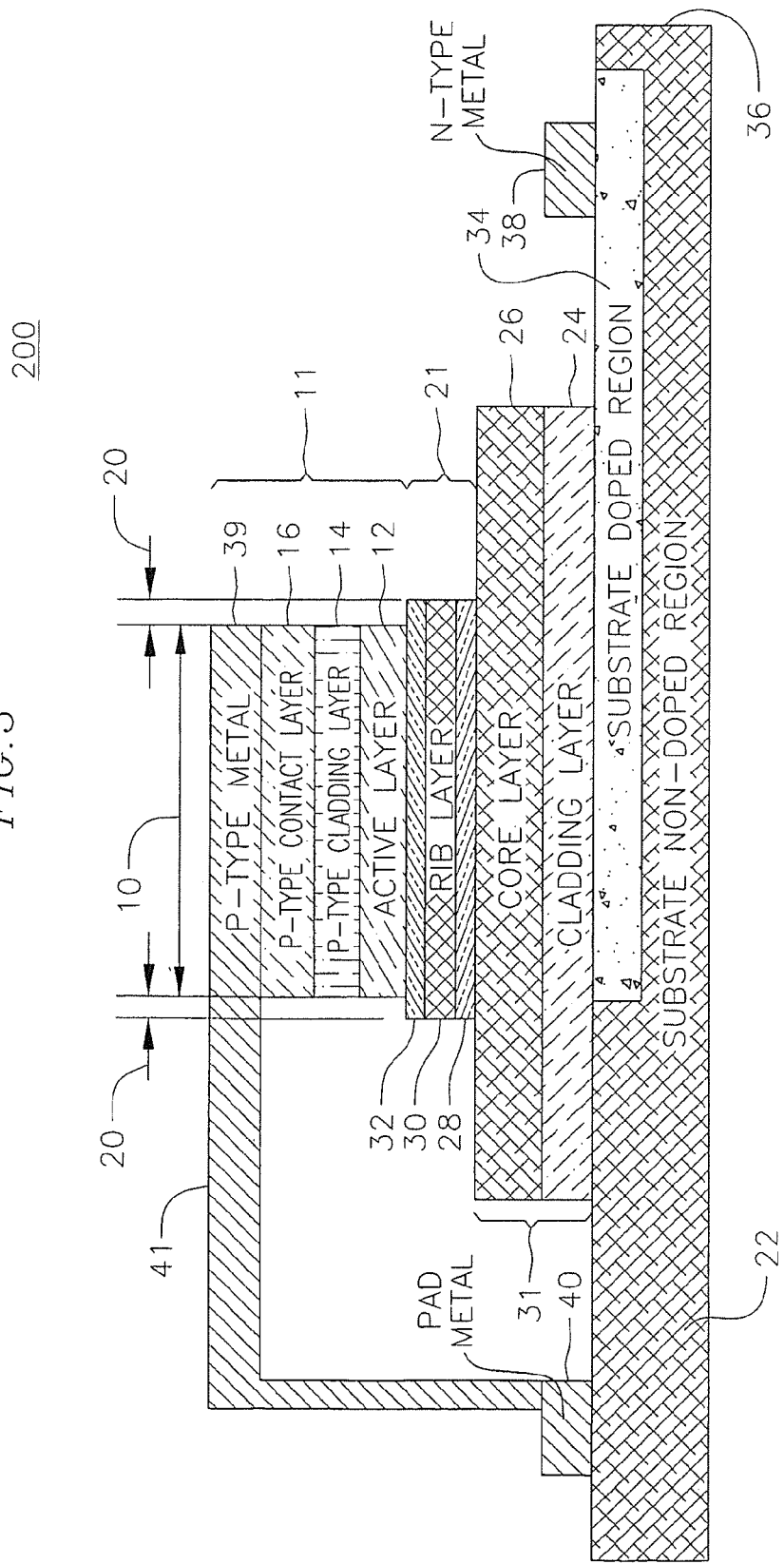
FIG. 3 shows a lateral cross-section of the SOA section of FIG. 2.

FIG. 3 shows a lateral cross-section of the SOA section 10 of FIG. 2 taken across the line A-A'. The lateral cross-section A-A' begins at the bottom with the substrate 22 that is partially doped in the substrate doped region 34. This cross-section shows an N-type metal 38 that is overlaid on a part of the substrate doped region 34 and is in electrical contact with the doped region 34. The N-type metal 38 is located such that it does not appear in the view shown in FIG. 2. A part of the substrate doped region 34 not overlaid by the N-type metal 38 is overlaid by the cladding layer 24, the waveguide core layer 26, the first spacer layer 28, the rib layer 30, the second spacer layer 32, the active layer 12, the P-type cladding layer 14, and the P-type contact layer 16 in that order. A pad metal 40 is also formed on the substrate 22 in the areas 36 of the substrate that are not doped and are therefore not conductive. The P-type metal 39 is patterned over the SOA section 10. The P-type metal 39 may be connected to the pad metal 40 through a conductive bridge 41. The N-type metal 38 may also be connected to another pad metal while this connection is not shown. Instead of being connected to pad metals, the N-type and P-type metals 38, 39 may be connected to another active optical or electronic device implanted on the same integrated circuit.

The top layers 39, 16, 14, and 12 together form an SOA mesa 11 of the PIC 200. The lower layers 32, 30, and 28 form a waveguide mesa 21 and the core layer 26 and the cladding layer 24 form an isolation mesa 31. An isolation mesa is used to isolate the active device. The isolation mesa 31 may also be used to provide access to the doped region of the substrate. So, the isolation mesa may also be referred to as a contact access mesa.

Figure 4:
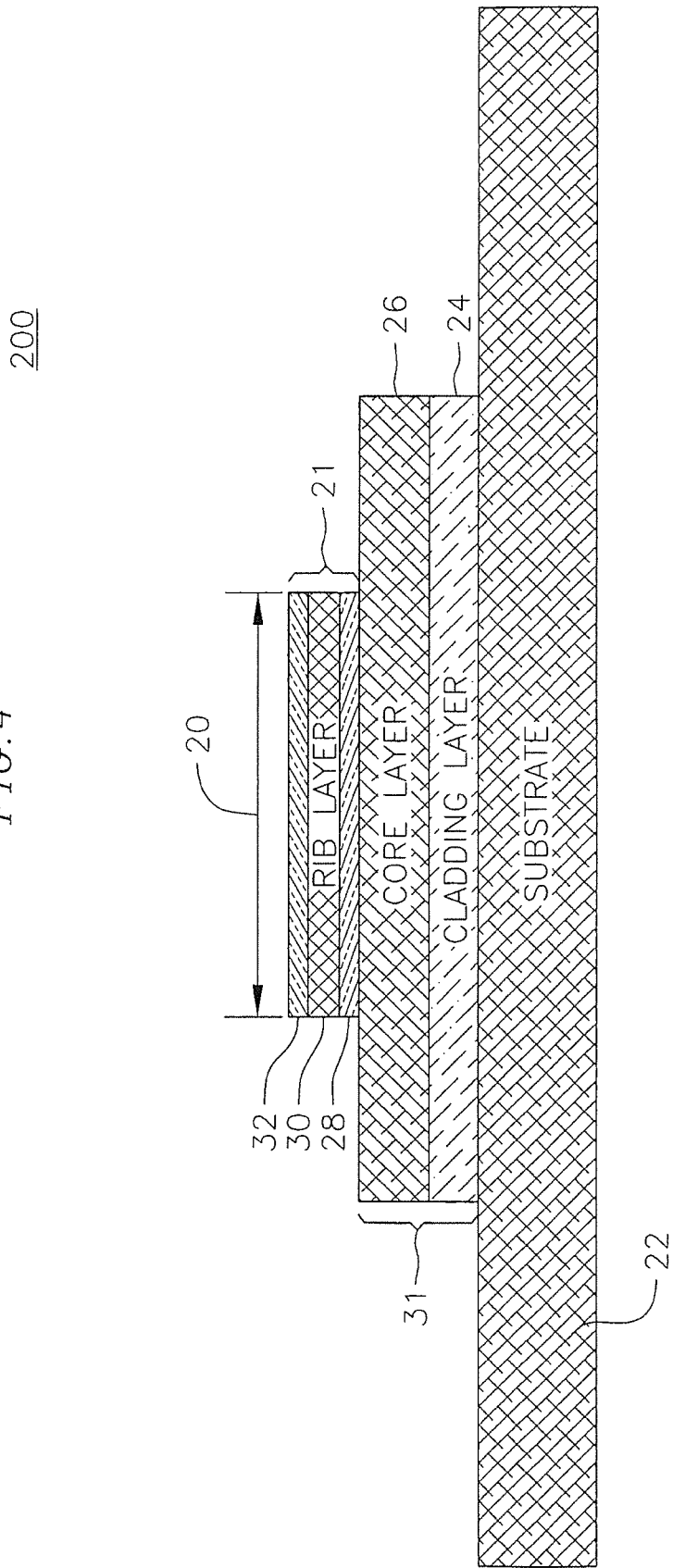
FIG. 4 shows a lateral cross-section of the waveguide section of FIG. 2.

FIG. 4 shows a lateral cross-section of the waveguide section 20 of FIG. 2 taken across B-B'. This cross-section begins at the bottom with the substrate 22 that is overlaid by the cladding layer 24. The waveguide core layer 26 lies over the cladding layer 24. The rib layer 30 lies over the waveguide core layer 26 and is separated from it by the first spacer layer 28. The second spacer layer 32 lies over the rib layer 30. The first spacer layer 28, the rib layer 30, and the second spacer layer 32 together form the waveguide mesa 21 of the PIC 200. The core layer 26 and the cladding layer 34 form the isolation mesa 31.

Figure 5:
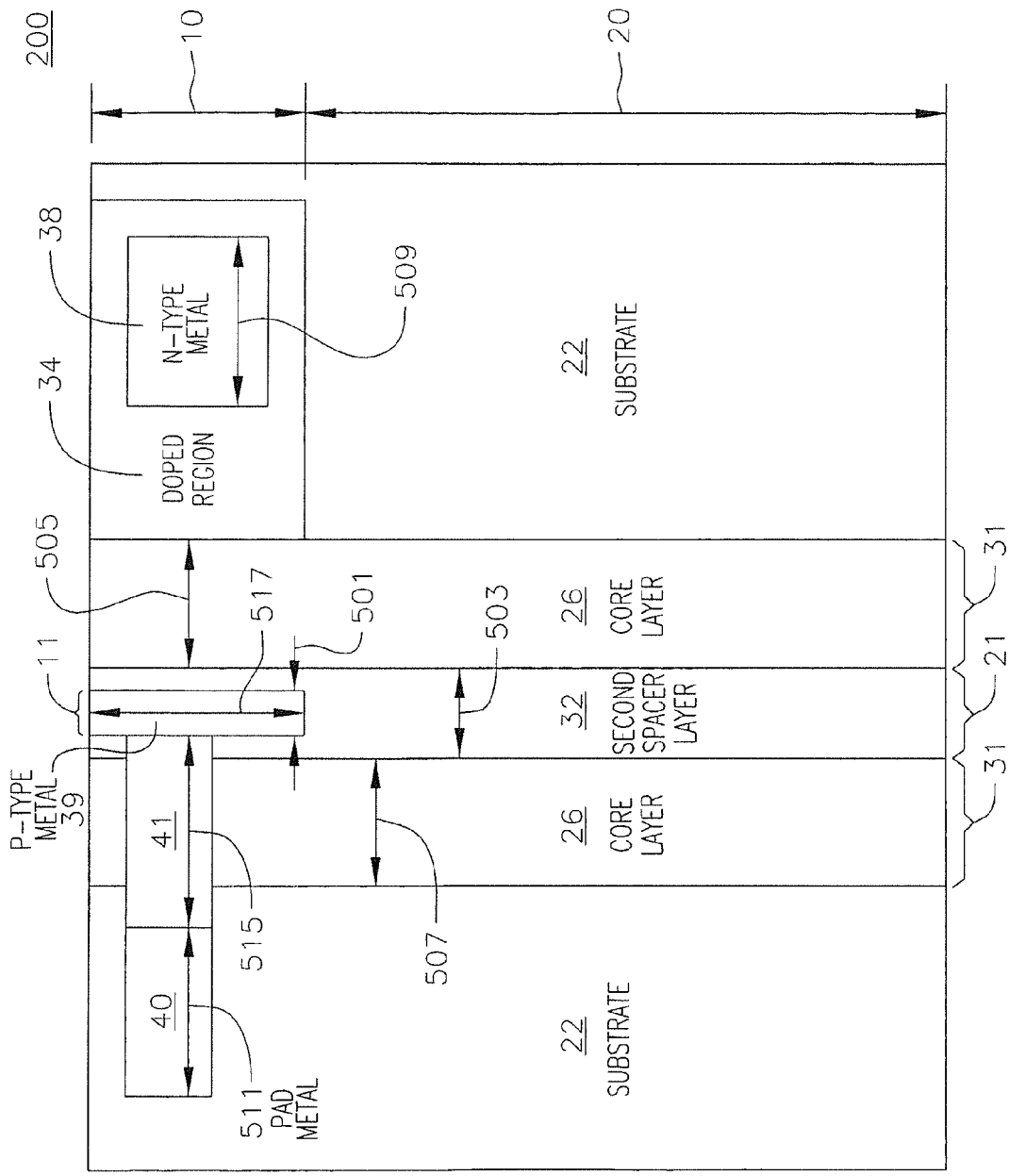
FIG. 5 shows a plan view of the PIC of FIG. 2.

FIG. 5 shows a plan view of the PIC 200 of FIG. 2. FIG. 5 shows how the P-type metal 39 and the N-type metal 38 are formed in the SOA section 10. The second spacer layer 32 above the Rib layer 30 extends over the waveguide mesa 21. Exemplary dimensions for each mesa or component may be set forth. In different embodiments, the dimensions may vary from those provided below as one example. The SOA mesa 11 may have a dimension 501 of about 2 μm in width. The waveguide mesa 21 may have a dimension 503 of about 4 μm in width. The isolation mesa 31 may have a dimension 505 of about 20 μm of width on either side of the waveguide mesa. Formation of the mesa provides isolation of the active device and allows contact to the doped region 34 to be formed. Setting the dimension 505 greater than 10 μm ensures that the optical mode in the waveguide is not disturbed by the edge of this mesa. Dimensions 509 and 511 for the N-type metal 38 and the pad metal 40 may be 100 μm of width. The N-type metal and the pad metal are wide in order to reduce ohmic contact resistance and provides space for wire-bonding. A distance between the SOA mesa 11 and the pad metal 40 may have a dimension 515 of about 25 μm. The SOA mesa 11 may be about 500 μm long in dimension 517 while the PIC 200 may be about 2 cm long. These dimension may be changed without compromising the core function of the device.

Embodiments of the invention include using SAD through ion implantation, thermal diffusion, or other appropriate methods before semiconductor epitaxial growth in order to define the contact and lateral current transport layers for each active device, while leaving passive devices undoped in the PICs.

FIG. 6 includes a flow chart 600 showing an exemplary fabrication process for the PIC 200 according to embodiments of the invention. The PIC 200 includes the SOA section 10 and the waveguide section 20, both including the floating rib waveguide. Fabrication of the PIC 200 starts with using a semi-insulating InP wafer as a substrate 42. Alternatively, fabrication may begin with a wafer with already grown epitaxial layers that foam only a part of the total epitaxial stack. Wafers made from GaAs, InGaAs, InGaAsP, and other material appropriate for photonic applications may also be used. Accordingly, InP related material, GaAs related materials, or other compound semiconductors may be used to form the substrate.

Next, alignment marks are etched 44 into the substrate or into the epitaxial layers. The alignment marks may be patterned or defined with another material such as Tungsten (W). After etching the alignment marks, an implantation mask is defined 46 leaving exposed the areas where the SOA mesa 11 and a the N-type metal 38 will be later located. In one embodiment, the mask material is able to withstand elevated temperatures, because InP implanted at elevated temperatures has higher dopant activation. In one embodiment the mask is removable. The mask material does not react with the semiconductor material and the processes for defining and removing the mask do not damage or contaminate the semiconductor surface. As an example of one type of implantation mask, the wafer may be coated with SiN for protection and then about 0.5 μm of Ti may be patterned by lift off or dry etching in chlorinated chemistry.

Photoresist is stripped 48 before implantation. Based on the exemplary wafer of InP being used as the substrate, for an N-type dopant, Si ions are implanted 50 at elevated temperatures using various energies and doses to obtain the desired dopant depth profile in the doped region of the substrate. For example, implants at a temperature of 275° C. and energy levels of 50 keV, 120 keV, 200 keV, and 300 keV produce a sufficiently even profile extending past a 350 nm depth. Alternatively, a P-type dopant may be used and the type of dopant will depend on the type of the wafer used as the substrate.

The implants are performed before epitaxial growth of the semiconductor layers of the active and passive devices 10, 20 in the PIC 200. Dopants are implanted into the growth substrate 22 or into an already epitaxially grown partial layer stack (not shown), before growing the rest of the epitaxial layer stack. Each implant may have different species and concentration profiles optimized for each active device, e.g., SOA section 10. Multiple implantation and regrowth cycles may be used for more complicated PICs.

As stated above, in some embodiments, SAD may be performed by thermal diffusion instead of ion implantation.

In various embodiments that use the implantation method of doping, implantation may be done directly into the substrate, or into already grown epitaxial layers. Implantation and growth may be repeated multiple times to create more complicated PICs where the selectively doped regions are on different levels.

Furthermore, the selectively doped regions do not have to be N-type, but may be P-type, with the top contact epitaxially grown layers being N-type. The dopants may be mixed, with some being P-type and others N-type. For N-type dopants, species other than Si may be used or combined together with Si. Various species may be used as P-type dopants as well. Some of the species might not need elevated anneal temperatures like those mentioned above.

After implantation, an anneal 52 before stripping the mask would ensure material inertness during the mask strip. In one embodiment, for example, the anneal 52 may be performed at approximately 300° C.

The mask is subsequently stripped 54. For example, an HF solution may be used to strip a mask of SiN and Ti.

The wafer is then annealed a second time 56 to electrically activate the dopants. For the exemplary dopant Si in an exemplary InP wafer the second annealing 56 is performed in a phosphine ambient. In one exemplary embodiment, the first and second annealing 56 is performed at approximately 660° C. in order to activate most of the dopants.

After the second annealing, the epitaxial layers for the SOA and waveguide sections are epitaxially grown 58 and last the SOA and waveguide sections are formed 60 by processes such as patterning by lift off or plating, etching, or deposition. Additional epitaxial growth may also be used. In different exemplary embodiments, molecular beam epitaxy (MBE) or chemical vapor deposition (CVD) may be used to produce the epitaxial growth. In one exemplary embodiment, metal-organic vapor deposition (MOCVD) methods may be used.

Figure 7B:
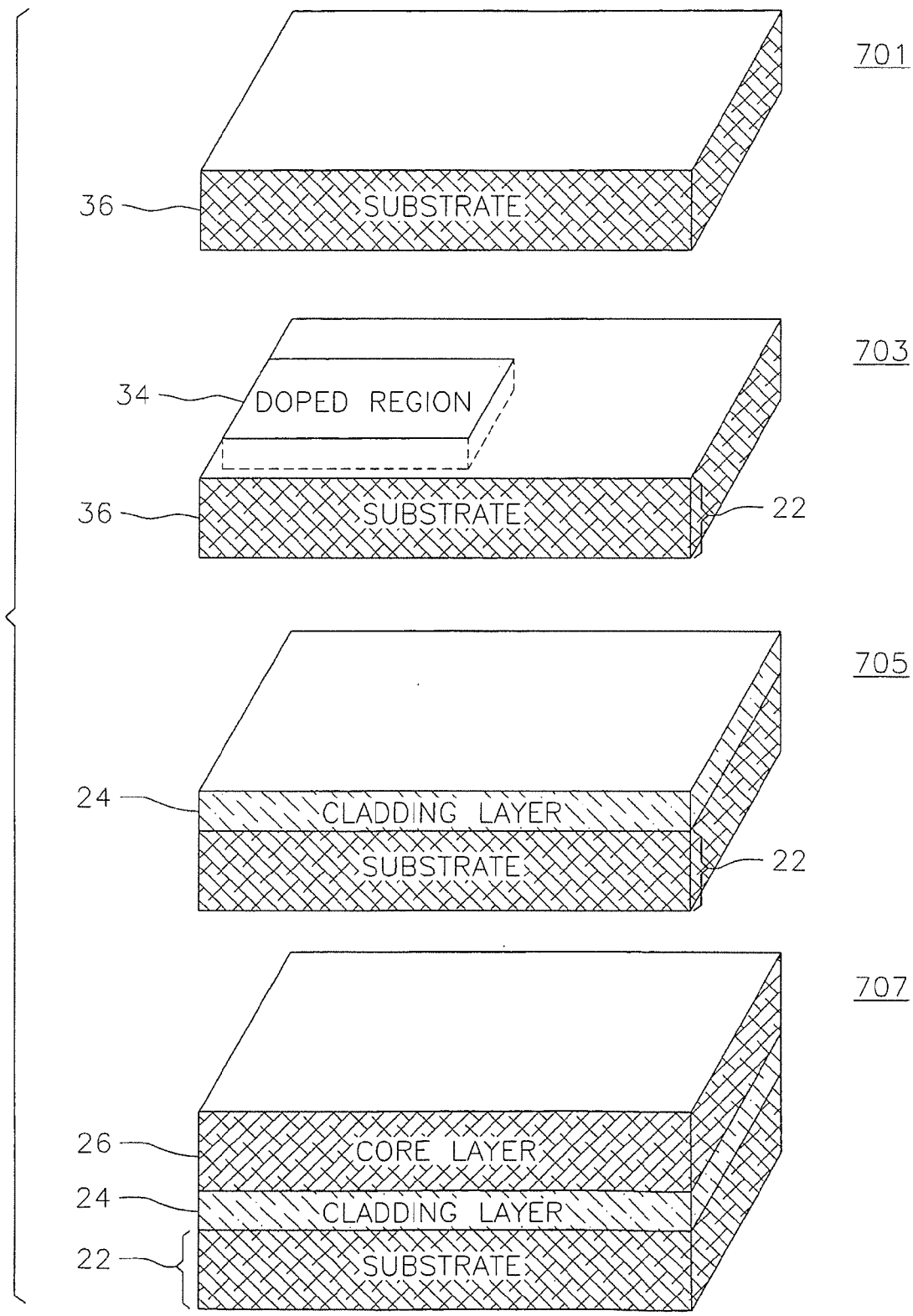
Figure 7D:
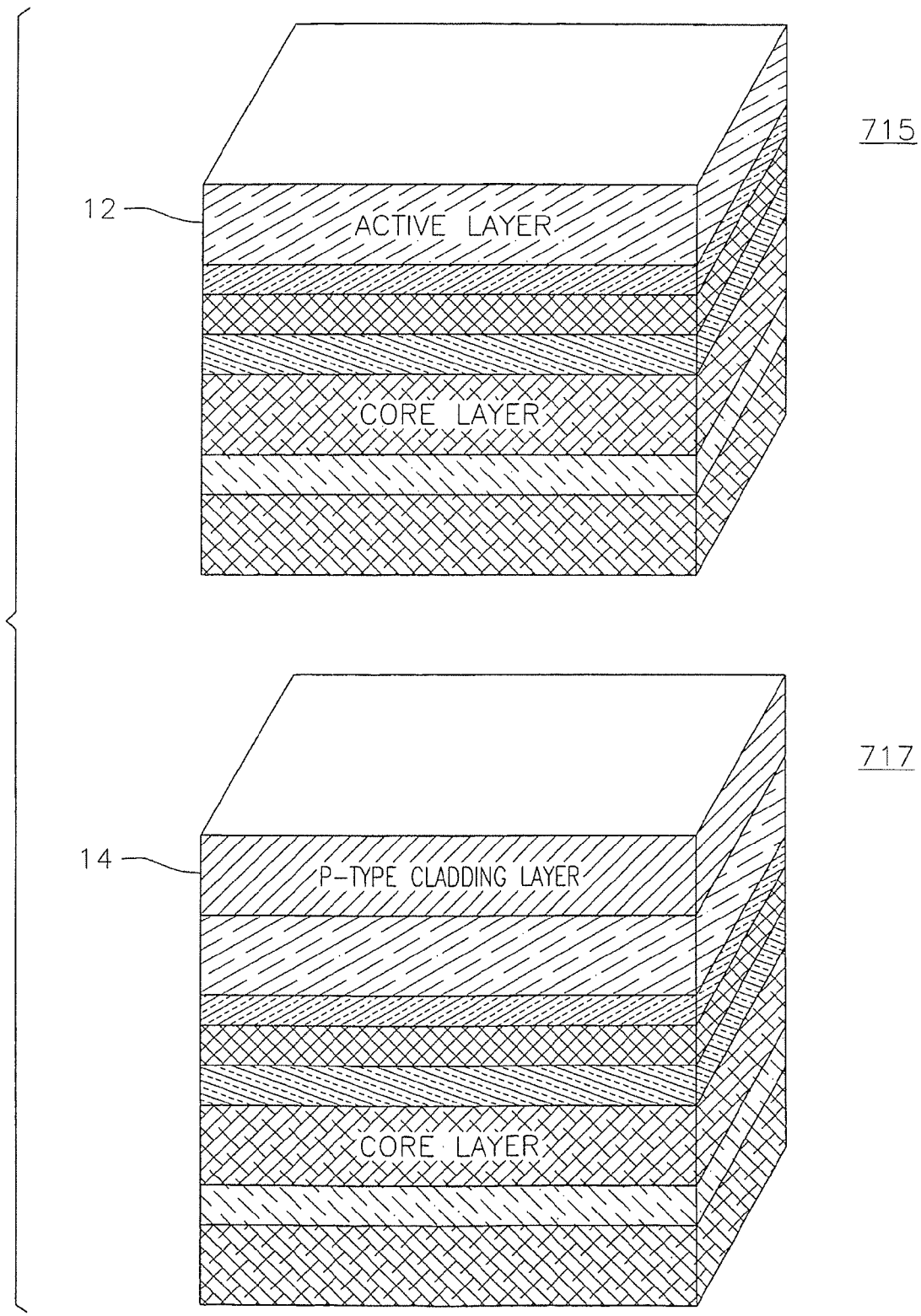
Figure 7E:
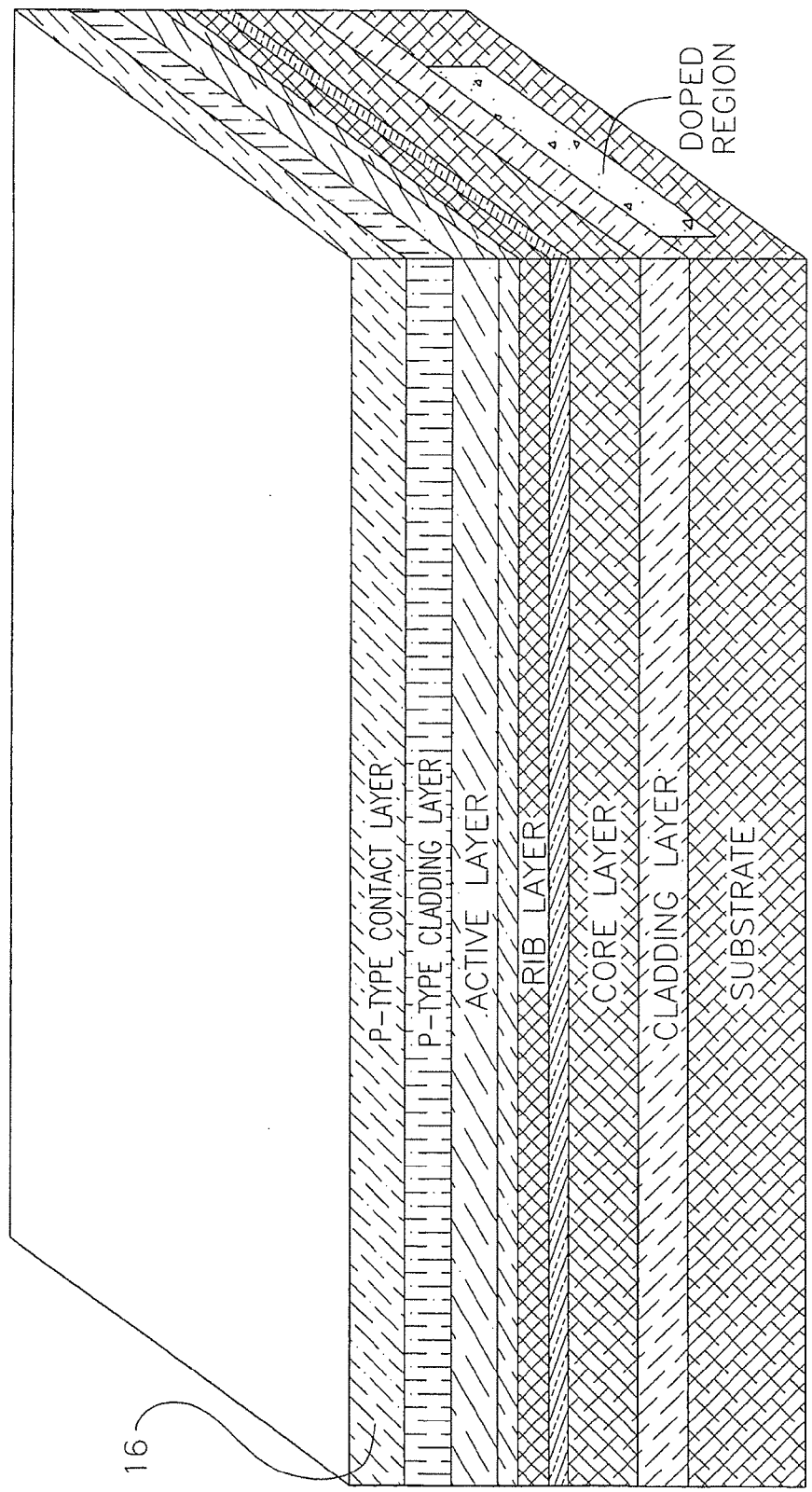
Figure 8A:
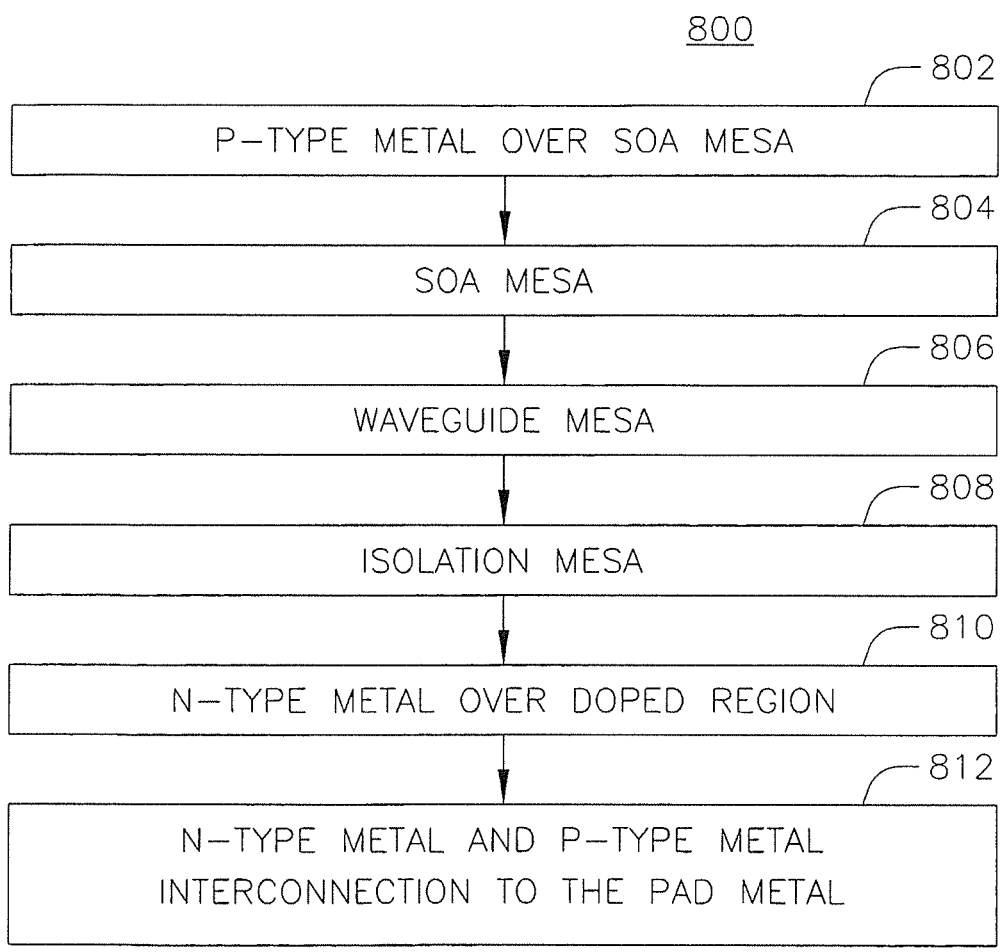
FIG. 8A shows a flow chart of an exemplary order of formation of various features of the PIC of FIG. 2.

FIGS. 7A and 8A show an exemplary order of formation of the PIC 200 of the invention and respectively correspond to steps 58 and 60 of FIG. 6. The formation may include the initial epitaxial growth and doping together with a subsequent patterning and etching of the deposited layers and growing new layers. FIGS. 7B, 7C, 7D, and 7E show perspective views of the layers forming the PIC 200 of the invention. FIGS. 8B, 8C, 8D, 8E, 8F, and 8G show perspective views of the layers remaining after each etch or deposition during each step of FIG. 8A.

As outlined by flow chart 700 of FIG. 7A, which flows from bottom to top, an exemplary set of epitaxial layers are obtained by taking a selectively doped substrate, such as layer 22 of FIG. 2, resulting from steps 701 and 703 and forming a bottom InP cladding layer (layer 24 of FIG. 2) over this substrate 705. The formation of the epitaxial layers may continue by forming an InGaAsP waveguide core (layer 26) in step 707, forming an InP spacer (layer 28) in step 709, forming an InGaAsP waveguide floating rib layer (layer 30) in step 711, forming another InP spacer (layer 32) in step 713, forming an SOA active layer that may be a multiple quantum well (layer 12) in step 715, forming a P-type InP cladding layer (layer 14) in step 717, and forming a P-type InGaAs contact layer for the SOA section (layer 16) in step 719. These layers may be epitaxially formed one after the other and layer upon layer. In one example, the SOA active layer is an InGaAs/AlGaInAs multiple quantum well.

As shown in FIGS. 7B-7E, the layers obtained by the steps of the flow chart 700 begin from the undoped substrate in step 701. The undoped substrate is then selectively doped in step 703. The cladding layer is formed over the selectively doped substrate in step 705. The core layer is formed over the cladding layer in step 707. The first spacer layer is formed over the core layer in step 709. The rib layer is formed over the first spacer layer in step 711. The second spacer layer is formed over the rib layer in step 713. The active layer is formed over the second spacer layer in step 715. The P-type cladding layer is formed over the active layer in step 717. The P-type contact is formed over the active layer in step 719. All of the above step may be performed by epitaxial growth of semiconductor layers.

In the exemplary embodiment of FIGS. 2 and 7A no N-type layers have been grown. Therefore, the only N-type semiconductor present is due to the doping in the doped region 34 and is confined to the area of the substrate corresponding to the active device or the SOA section 10.

Forming the SOA and waveguide sections in step 60 follows growing the waveguide layers in step 58 of FIG. 6. During this step, as shown by the flow chart 800 in FIG. 8A, first 802 the P-type metal 39 is formed over the P-type contact layer 16 of the SOA mesa 11. Examples of the metal include Ti, Pt, or Au. Then 804, the SOA mesa 11 is formed, then 806 the waveguide mesa 21 is formed, then 808 the isolation mesa 31 is formed, then 810 the N-type metal 38 is formed, and last 812 the N-type 38 and P-type 39 metals are interconnected to the pad metal 40. In some embodiments, an extra cladding layer may be formed over the PIC 200 that leaves the metals 38, 39, 40 exposed for connection.

Figure 8B:
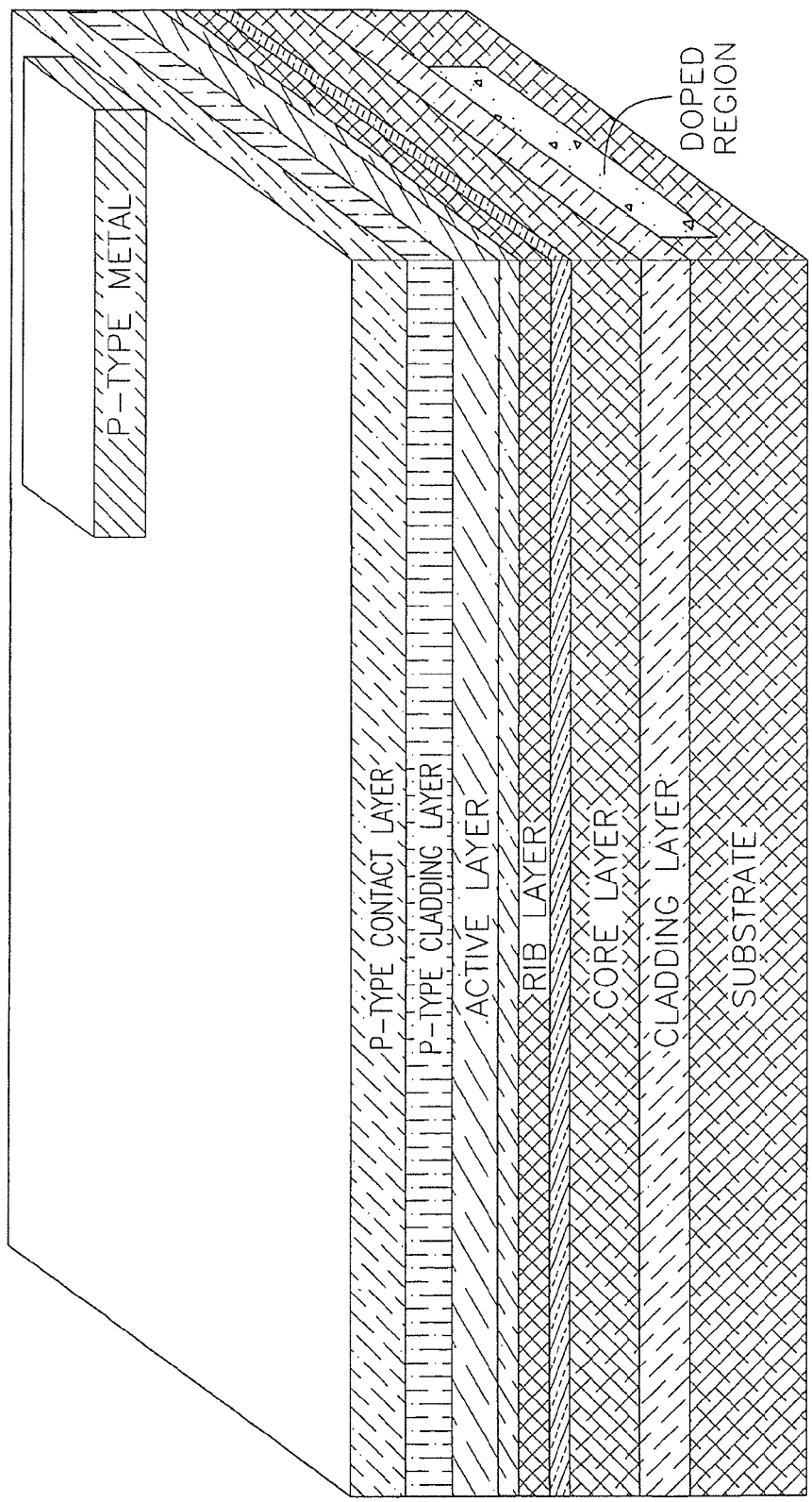
FIGS. 8B, 8C, 8D, 8E, 8F, and 8G show perspective views of the layers remaining after each etch and subsequent formation of the PIC of FIG. 2 according to the flow chart of FIG. 8A.

FIG. 8B shows the patterning of the P-type metal 39 over the formerly grown epitaxial layers in an area corresponding to the SOA mesa 11.

Figure 8C:
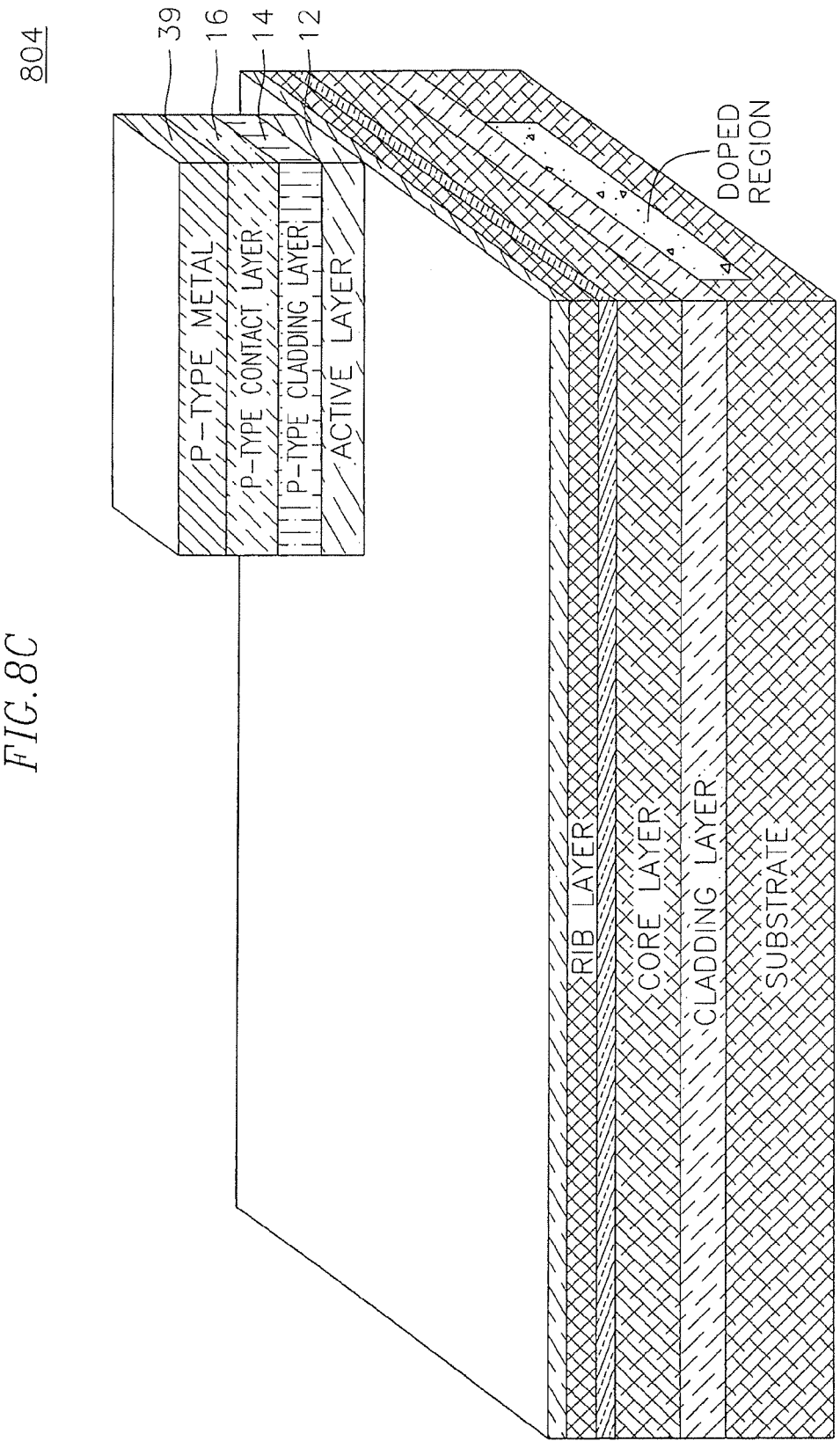

As shown in FIG. 8C, the SOA mesa (layers 39, 12, 14, and 16) is formed by etching away the P-type contact layer 16, the P-type cladding layer 14, and the active layer 12 everywhere except under the SOA mesa 11 which is marked by the P-type metal 39.

Figure 8D:
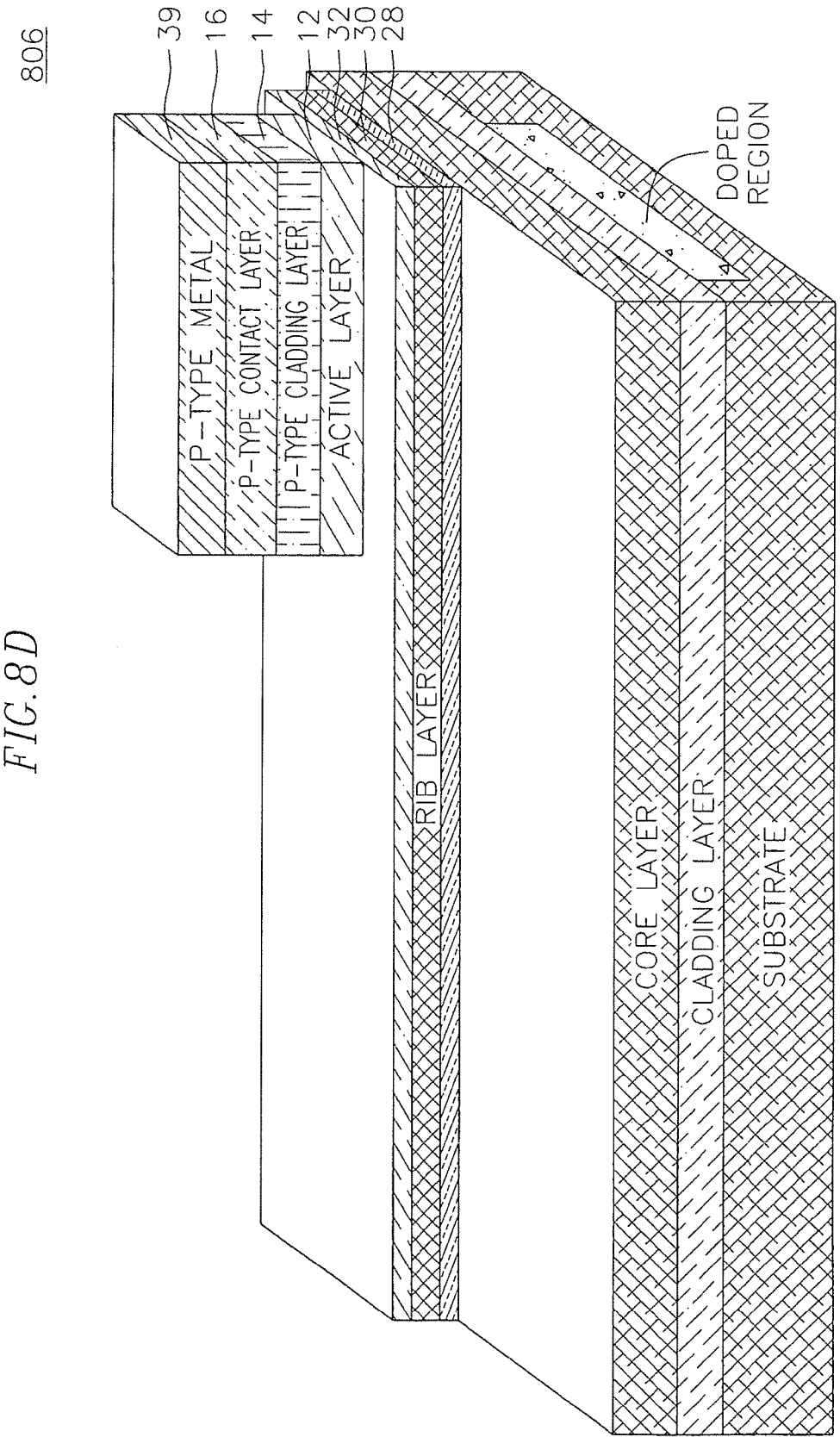

As shown in FIG. 8D, during the formation of the waveguide mesa 21, the second spacer 32, the rib layer 30, and the first spacer 28, are etched away everywhere except where the waveguide mesa 21 would be.

Figure 8E:
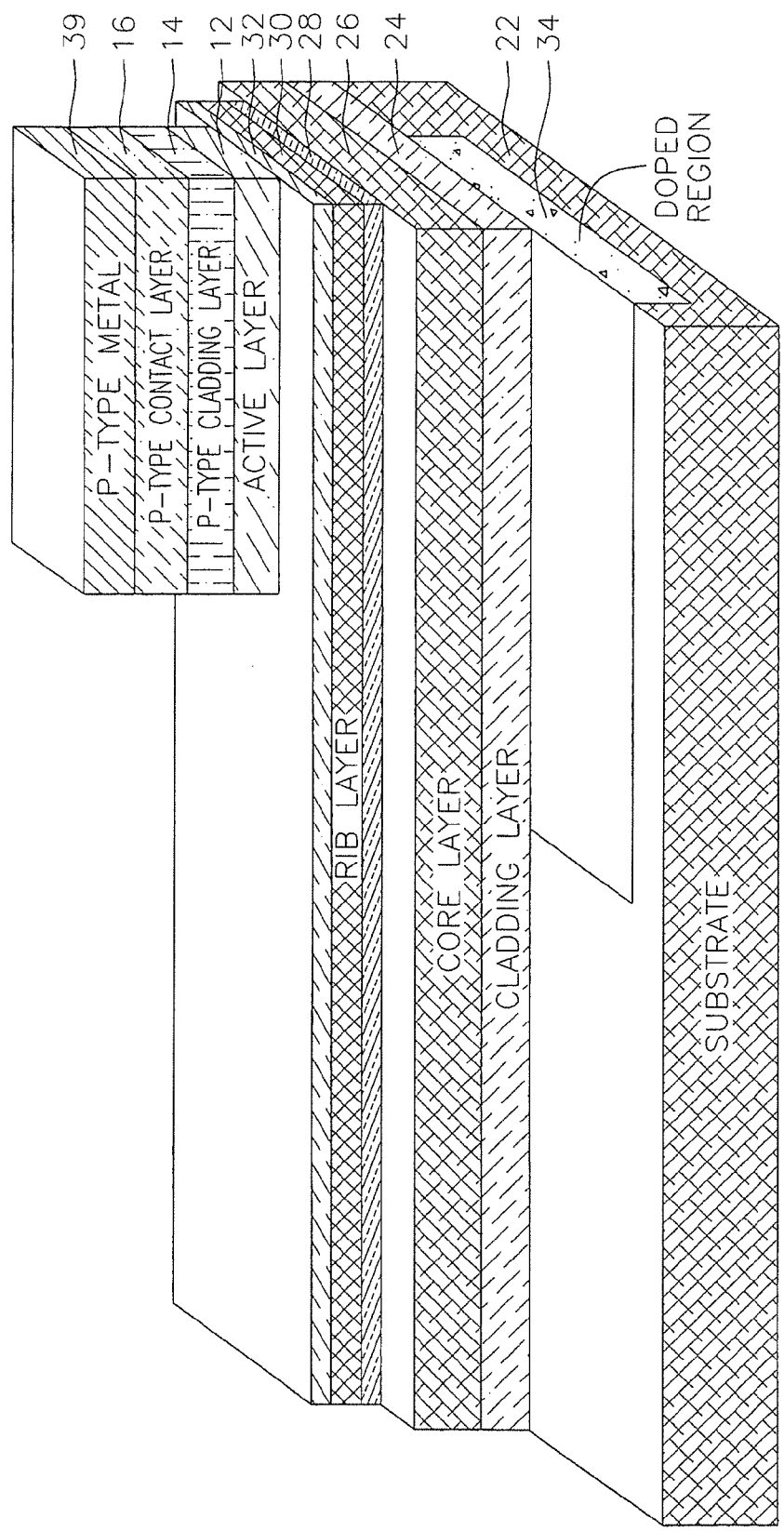

As shown in FIG. 8E, during the formation of the isolation mesa 31, the core layer 26 and the cladding layer 24 are etched away to reach the substrate 22. These layers 26 and 24 are etched away in areas where the optical field is weak. The optical field is usually weaker approximately 10 μm away from the waveguide mesa 21. Formation of the isolation mesa by etching away the core and cladding layers also provides contact access to the substrate doped region 34 so that an ohmic contact with the N-type metal 38 has a place for being formed.

In different embodiments, dry or wet etching may be used to carry out the above processes. For dry etching, either a methane/hydrogen mixture or a high temperature chlorinated mixture etch may be used. Wet etching may use a HCl mixture for an InP wafer, a citric acid and peroxide mixture for an InGaAs wafer, and a sulfuric acid and peroxide mixture for an InGaAsP wafer.

Figure 8F:
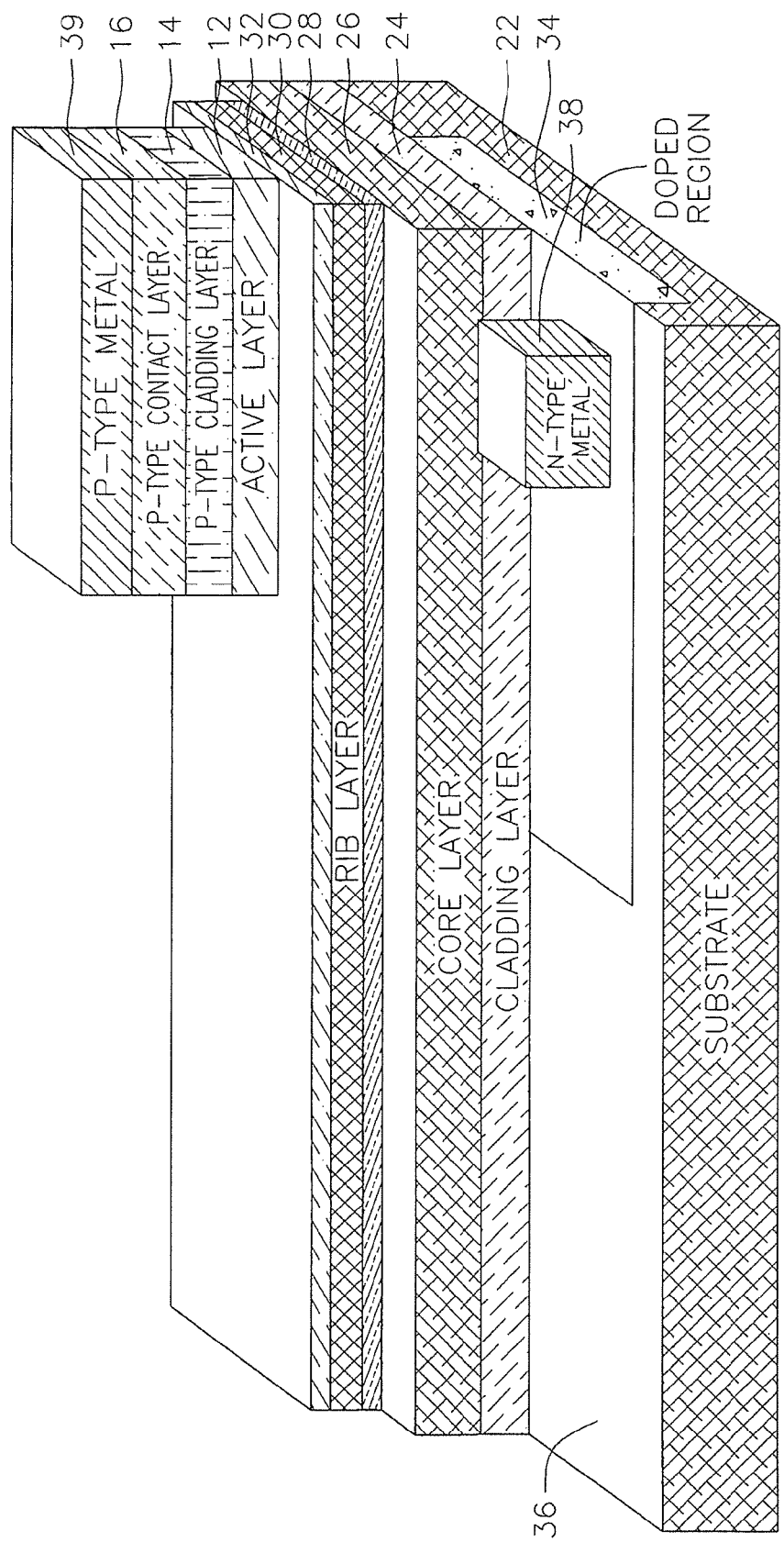

As shown in FIG. 8F, a part of the substrate doped region 34 intended for the N-type metal 38 is exposed during the previous etch for formation of the waveguide mesa. The N-type metal 38 is deposited on the exposed doped region. The N-type metal 38 may be formed from AuGe, for example. In alternative embodiments, the location of the contacts with each majority carrier may be interchanged if the doping of the doped region 34 and the active layer 12 and the layer above it are changed. Further, the ohmic contacts, may be formed of a metal, such as the N-type and P-type metals 38, 39 shown, or of another conductive material.

Figure 8G:
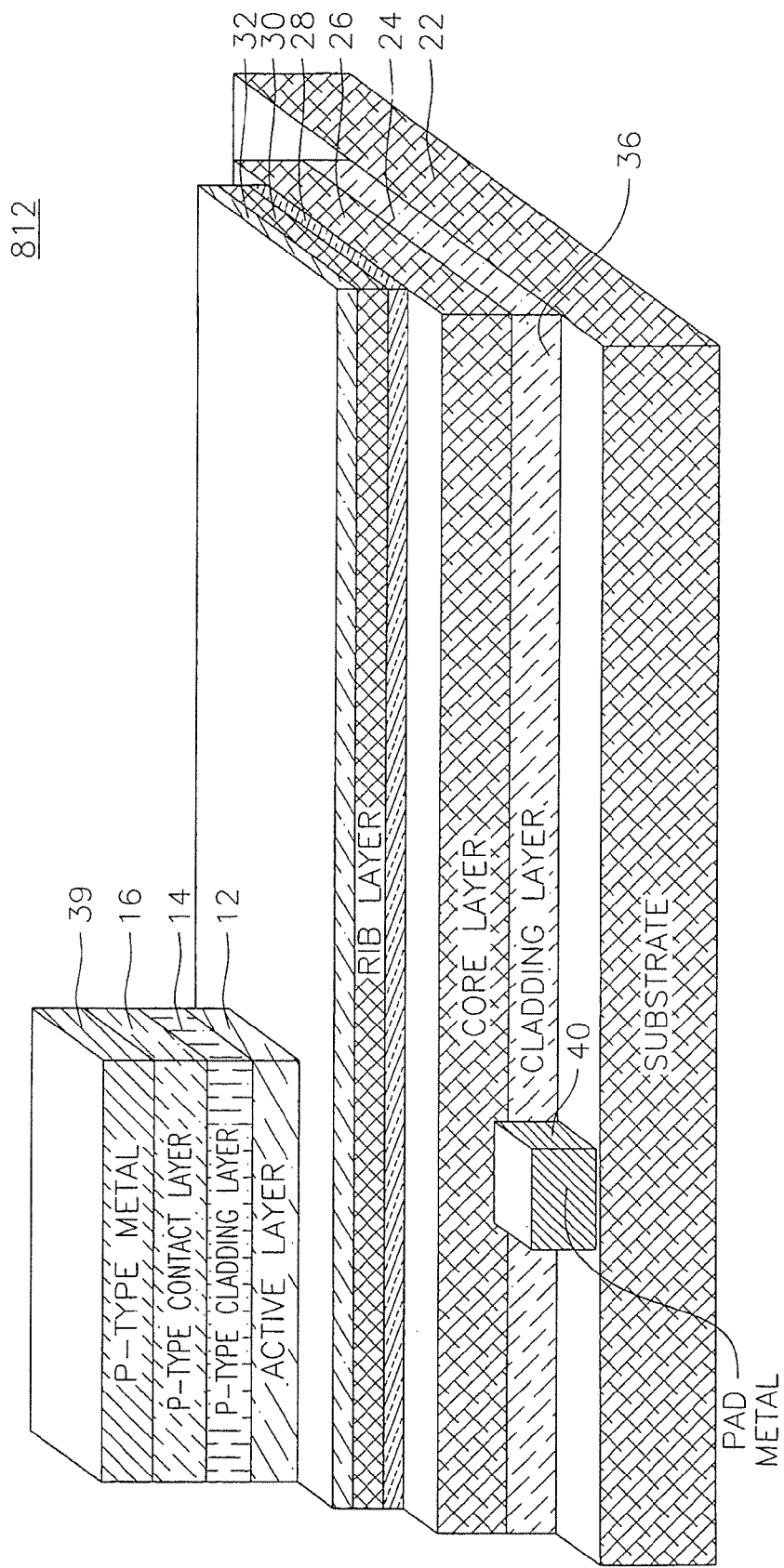

As shown in FIG. 8G, the pad metal 40 may be formed. The pad metal 40 may be deposited in any part of the non-implanted area 36 because the substrate 22 is not conductive. Finally, the N-type and P-type metals 38, 39 may be interconnected 108 to the pad metal 40 (not shown).

While not shown, a second cladding layer may be formed over the PIC. Selective area regrowth of a top waveguide cladding layer may be performed after etching off the layers above at any time during the process 800. During selective area regrowth, InP, for example, may be regrown.

In other embodiments of the invention, the PIC 200 could include any combination of active and passive devices. Examples of active devices include lasers, modulators, amplifiers, detectors, and the like. Examples of passive devices include waveguides, couplers, splitters, resonators, gratings, and the like. The transverse optical coupling of the components may be achieved by having the same waveguide core layer, regrowing one or more cores and coupling them, or having multiple cores and using co-propagating, counter-propagating, or evanescent vertical coupling.

While, exemplary embodiments of this invention are explained with respect to InP-based PICs, other semiconductor PIC devices would also benefit. The focus on InP-based PICs is due to the fact that most optoelectronic active devices operate at 1.3 μm or 1.5 μm wavelength and are made of InP and related material.

Selective area doping of electrically active species before the growth of device layers for the purpose of optimization of individual PIC component devices has not been performed before. This is because using SAD before epitaxial semiconductor growth for PICs was not possible until recently. The technology for implantation of InP, and its related materials, or for subsequent growth did not exist. The technology for implantation and post-implantation epitaxial III-V semiconductor growth is quite recent. Particularly, the technology for implantation and regrowth for InP and related materials ($In_xGa_{1-x}As_yP_{1-y}$, InAlAs) has only recently been demonstrated in its practicable and advanced levels and is only available to the inventors. There are no commercial electronic or optoelectronic InP devices that use this technology. Implantation of InP, and related materials, is not common or trivial.

Further, epitaxial growth on implanted material is complicated. Even in GaAs wafers, where implantation for electronic materials is more common, there are no examples of electrically active implantation before epitaxial growth for PICs. Thus, until now implantation has been used in planar optoelectronics for current confinement and isolation (proton and oxygen implantation) and heterostructure interface damage to widen the band gap of quantum wells. In addition to the difficulties in technology for pre-growth implantation, the higher level of integration and lower required passive component losses needed for the new all-optical signal processing PICs that demand a solution better than the state of the art technology have only recently become important.

The invention presented applies to a wide variety of applications. Because this invention provides great benefits to any PIC that has active components, it would benefit many fiber-optic communication components that are made today. However, a greater benefit would be to PIC systems that are currently being developed. These systems use PICs as high speed all optical front ends of various high-speed circuits. For these systems, passive component loss is extremely important and high level monolithic integration on the PIC and with electronics is crucial.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. A method for fabricating a photonic integrated circuit comprising:
    forming a substrate from an InP related material;
    selective doping of a first part of the substrate to form a first selectively doped region;
    forming a first active device section over the first part of the substrate; and
    forming a passive device section over a second part of the substrate,
    wherein the first selectively doped region has majority carriers of a first polarity and is not in the second part of the substrate, and
    wherein the first active device section and the passive device section include epitaxial layers grown over the substrate.

2. The method of claim 1, wherein the selective doping is performed by ion implantation.

3. The method of claim 1, wherein the selective doping is performed by thermal diffusion.

4. The method of claim 2, wherein the selective doping is performed by implanting Si ions in an exposed region of the substrate.

5. The method of claim 4, wherein the Si ions are implanted at substantially 275° C.

6. The method of claim 4, wherein the Si ions are implanted at an energy level selected from a group consisting of substantially 50 KeV, 120 KeV, 200 KeV, and 300 KeV.

7. A method for fabricating a photonic integrated circuit, the photonic integrated circuit including a passive device and an active device, the method comprising:
    providing a substrate from a wafer formed of semi-insulating InP related material;
    defining a mask over the substrate leaving a region of the substrate exposed to obtain an exposed region;
    selective doping of the exposed region with an impurity having a majority carrier of a first polarity to obtain a doped region within the substrate and to form a selectively doped substrate;
    first annealing the selectively doped substrate;
    stripping the mask;
    second annealing the selectively doped substrate;
    growing epitaxial layers over the selectively doped substrate, the epitaxial layers including one or more layers being doped with a majority carrier of a second polarity;
    patterning a first ohmic contact material on an upper layer of the epitaxial layers over a first area of the selectively doped substrate;
    forming the active device from the epitaxial layers over the first area;
    forming the passive device from the epitaxial layers over a second area of the selectively doped substrate;
    forming an isolation mesa from the epitaxial layers over a third area of the selectively doped substrate, formation of the isolation mesa exposing a portion of the doped region to obtain an exposed doped region; and
    patterning a second ohmic contact material over the exposed doped region, wherein the isolation mesa is sufficiently wide for isolating an optical field forming within the active device and the passive device, and wherein the first area, the second area, and the third area overlap.

8. The method of claim 7, further comprising coating the wafer with a layer of SiN before defining the mask, the mask being formed from approximately 0.5 μm of Ti.

9. The method of claim 7, wherein the mask is able to withstand a temperature of substantially 600° C.

10. The method of claim 7, wherein the first annealing is performed at substantially 300° C.

11. The method of claim 8, wherein the mask of Ti and the layer of SiN are stripped using a HF solution.

12. The method of claim 7, wherein the second annealing is performed at substantially 660° C.

13. The method of claim 7, wherein growing epitaxial layers over the selectively doped substrate includes:
  growing a first cladding layer over the selectively doped substrate;
  growing a waveguide core over the first cladding layer;
  growing a first spacer over the waveguide core;
  growing a waveguide floating rib over the first spacer;
  growing a second spacer over the waveguide floating rib;
  growing a semiconductor optical amplifier active layer over the second spacer;
  growing a second cladding layer over the active layer; and
  growing a contact layer over the second cladding layer.

14. The method of claim 13,
wherein forming the active device includes removing portions of the contact layer, the second cladding layer, and the semiconductor optical amplifier active layer down to the second spacer wherein the contact layer, the second cladding layer and the semiconductor optical amplifier active layer remain only over the first area of the selectively doped substrate, wherein forming the passive device includes removing portions of the second spacer, the waveguide floating rib, and the first spacer down to the core layer wherein the second spacer, the waveguide floating rib, and the first spacer remain only over the second area of the selectively doped substrate, wherein forming an isolation mesa includes removing portions of the core layer and the first cladding layer down to the selectively doped substrate wherein the core layer and the first cladding layer remain only over the third area of the selectively doped substrate.

* * * * *